United States Patent
Ting et al.

(10) Patent No.: US 11,049,891 B2
(45) Date of Patent: Jun. 29, 2021

(54) PIXEL ARRAY SUBSTRATE

(71) Applicant: Au Optronics Corporation, Hsinchu (TW)

(72) Inventors: Yu-Hsin Ting, Kaohsiung (TW); Chung-Lin Fu, Hsinchu (TW); Wei-Chun Hsu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 160 days.

(21) Appl. No.: 16/525,621

(22) Filed: Jul. 30, 2019

(65) Prior Publication Data

US 2020/0185434 A1    Jun. 11, 2020

Related U.S. Application Data

(60) Provisional application No. 62/775,469, filed on Dec. 5, 2018.

(30) Foreign Application Priority Data

Jan. 31, 2019   (TW) ................................ 108103815

(51) Int. Cl.
  *H01L 27/146*   (2006.01)
  *G09G 3/20*     (2006.01)
  *H01L 27/12*    (2006.01)

(52) U.S. Cl.
  CPC ..... *H01L 27/14603* (2013.01); *G09G 3/2092* (2013.01); *H01L 27/124* (2013.01)

(58) Field of Classification Search
  None
  See application file for complete search history.

(56) References Cited

U.S. PATENT DOCUMENTS

| 10,101,622 B2 | 10/2018 | Wang et al. |
| 10,127,855 B2 | 11/2018 | Zhang et al. |
| 2016/0063912 A1 | 3/2016 | Zhang et al. |
| 2019/0051668 A1* | 2/2019 | Huang ............... H01L 27/124 |

FOREIGN PATENT DOCUMENTS

| CN | 1632650 | 6/2005 |
| CN | 103149753 | 6/2013 |
| CN | 105388647 | 3/2016 |
| CN | 103560134 | 11/2016 |

\* cited by examiner

*Primary Examiner* — Moazzam Hossain
*Assistant Examiner* — Stanetta D Isaac
(74) *Attorney, Agent, or Firm* — JCIPRNET (57) ABSTRACT

A pixel array substrate includes signal lines, pixel structures, a driving element, a first fan-out trace and a second fan-out trace. The first fan-out trace includes a first segment connected to the driving element, a second segment connected to the first segment, and a third segment connected to the second segment. In the first fan-out trace, the sheet resistances of the first segment and the third segment are smaller than sheet resistance of the second segment. The second fan-out trace includes a first segment connected to the driving element and a second segment connected to the first segment. In the second fan-out trace, the first segment and the second segment are disposed correspondingly to the first segment and the two second segment and third segment, respectively. In the second fan-out trace, the sheet resistance of the second segment is less than the sheet resistance of the first segment.

10 Claims, 6 Drawing Sheets

PIXEL ARRAY SUBSTRATE

CROSS-REFERENCE TO RELATED APPLICATION

This application claims the priority benefit of U.S. provisional application Ser. No. 62/775,469, filed on Dec. 5, 2018, and Taiwan application serial no. 108103815, filed on Jan. 31, 2019. The entirety of each of the above-mentioned patent applications is hereby incorporated by reference herein and made a part of this specification.

BACKGROUND

Technical Field

The disclosure relates to a pixel array substrate, and particularly to a pixel array substrate of a display panel.

Description of Related Art

With the development and popularization of display technology, not only the consumer requires display panels having high resolution, high contrast, high color saturation and wide viewing angle, the consumer also has requirements about aesthetic of the display panel. For example, the consumer hopes that the display panel has a narrow border or even without border. Generally, a plurality of signal lines disposed in the active area of the display panel are electrically connected to the driving element of the display panel through a plurality of fan-out traces, which are disposed in the border area (or the peripheral area) of the display panel. When the display panel has high resolution, the number of signal lines is large, and the large number of signal lines need being electrically connected to the driving element of the display panel through a large number of fan-out traces. However, when the number of fan-out traces is large, it is not easy to reduce the width of the border of the display panel.

SUMMARY

The disclosure provides a pixel array substrate that has a peripheral area having narrow width.

A pixel array substrate of the disclosure includes a substrate, a plurality of signal lines, a plurality of pixel structures, a driving element, and a plurality of fan-out traces. The signal lines are disposed on the substrate. The pixel structures are electrically connected to the signal lines. The driving element is disposed on the substrate. Each of the fan-out traces is electrically connected to one of the signal lines and the driving element. The fan-out traces includes at least one first fan-out trace and at least one second fan-out trace. The first fan-out trace includes a first segment connected to the driving element, a second segment connected to the first segment, and a third segment connected to the second segment. The sheet resistance of the first segment of the first fan-out trace and the sheet resistance of the third segment of the first fan-out trace are smaller than sheet resistance of the second segment of the first fan-out trace. The second fan-out trace includes a first segment connected to the driving element and a second segment connected to the first segment of the second fan-out trace. The first segment of the second fan-out trace is disposed correspondingly to the first segment of the first fan-out trace. The second segment of the second fan-out trace is disposed correspondingly to the second segment and the third segment of the first fan-out trace. The sheet resistance of the second segment of the second fan-out trace is less than the sheet resistance of the first segment of the second fan-out trace.

In one embodiment of the invention, each of the at least one first fan-out trace includes a transfer structure. The transfer structure includes a first conductive pattern, a second conductive pattern, a first insulating layer, a second insulating layer, and a bridge pattern. The first conductive pattern is directly connected to the second segment of the first fan-out trace. The second conductive pattern is directly connected to the third segment of the first fan-out trace. The first insulating layer is disposed between the first conductive pattern and the second conductive pattern. The second insulating layer is disposed on the second conductive pattern and has at least one contact window. The bridge pattern is disposed on the second insulating layer and electrically connecting the first conductive pattern and the second conductive pattern through the at least one contact window of the second insulating layer.

In one embodiment of the disclosure, the first insulating layer has a contact window, an edge of the contact window of the first insulating layer, a part of an edge of the second conductive pattern, and a part of an edge of the at least one contact window of the second insulating layer are substantially aligned.

In one embodiment of the disclosure, the signal lines are arranged in a first direction, the at least one first fan-out trace includes a plurality of first fan-out traces, the transfer structures of the first fan-out traces are arranged in a second direction, and the first direction is perpendicular to the second direction.

In one embodiment of the disclosure, the signal lines are arranged in a first direction, the at least one first fan-out trace includes a plurality of first fan-out traces, the transfer structures of the first fan-out traces are arranged in a third direction, the first direction and the third direction are intersected, and the first direction is not perpendicular to the third direction.

In one embodiment of the disclosure, the at least one first fan-out trace includes a plurality of first fan-out traces, the first fan-out traces includes a plurality of transfer structures, respectively, a plurality of virtual straight lines pass through the transfer structures, each of the virtual straight lines passes through two adjacent transfer structures in the transfer structures, and the virtual straight lines are connected to form a virtual zigzag line.

In one embodiment of the disclosure, the at least one first fan-out trace includes a plurality of first fan-out traces, the first fan-out traces includes a plurality of transfer structures, respectively, the at least one second fan-out trace includes a plurality of second fan-out traces, the second segments of the second fan-out traces have a plurality of bent portions, respectively, and the bent portions of the second fan-out traces are disposed correspondingly to the transfer structures of the first fan-out traces, respectively.

In one embodiment of the disclosure, an orthogonal projection of the second segment of each of the at least one first fan-out trace on the substrate and an orthogonal projection of the second segment of each of the at least one second fan-out trace on the substrate have a first space S1 therebetween, an orthogonal projection of the third segment of each of the at least one first fan-out trace on the substrate and an orthogonal projection of the second segment of each of the at least one second fan-out trace on the substrate have a second space S2 therebetween, and S1<S2.

In one embodiment of the disclosure, a part of the second segment of each of the at least one first fan-out trace has a line width W1, a part of the second segment of each of the at least one second fan-out trace has a line width W2, and W2>W1.

In one embodiment of the disclosure, the first segment of each of the at least one first fan-out trace has a length L1, the second segment of each of the at least one first fan-out trace has a length L2, and the third segment of each of the at least one first fan-out trace has a length L3, and (L1+L2)/(L1+L2+L3)≤50%.

In order to make the aforementioned and other features and advantages of the disclosure more comprehensible, embodiments accompanying figures are described in detail belows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Descriptions of the disclosure are given with reference to the exemplary embodiments illustrated with accompanied drawings. Wherever possible, in the drawings and the specification, the same or similar parts are denoted with same reference numerals.

It should be understood that when an element such as a layer, a film, an area, or a substrate is indicated to be "on" another element or "connected to" another element, it may be directly on another element or connected to another element, or an element in the middle may be existed. In contrast, when an element is indicated to be "directly on another element" or "directly connected to" another element, an element in the middle is not existed. Herein, "connect" indicated in the specification may indicate physically and/or electrically connect. Furthermore, "electrically connect" or "coupled to" may be indicated that other element exists between two elements.

The usages of "approximately", "similar to", or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may be indicated that within one or more standard deviations of the value, or within ±30%, ±20%, ±10%, ±5%. Furthermore, the usages of "approximately", "similar to" or "substantially" indicated throughout the specification may be referred to a more acceptable deviation scope or standard deviation depending on optical properties, etching properties, or other properties, and all properties may not be applied with one standard deviation.

Unless otherwise defined, the terms used throughout the specification (including both technical and scientific terms) has the same meaning understood by people skilled in the art. It should be further understood that, terms such as those defined in commonly used dictionaries should be interpreted as having meanings consistent with the meanings in the prior art and the context of the invention, and shall not be interpreted as an idealized or overly formal meaning, unless they are definitely defined in the content.

Figure 1:
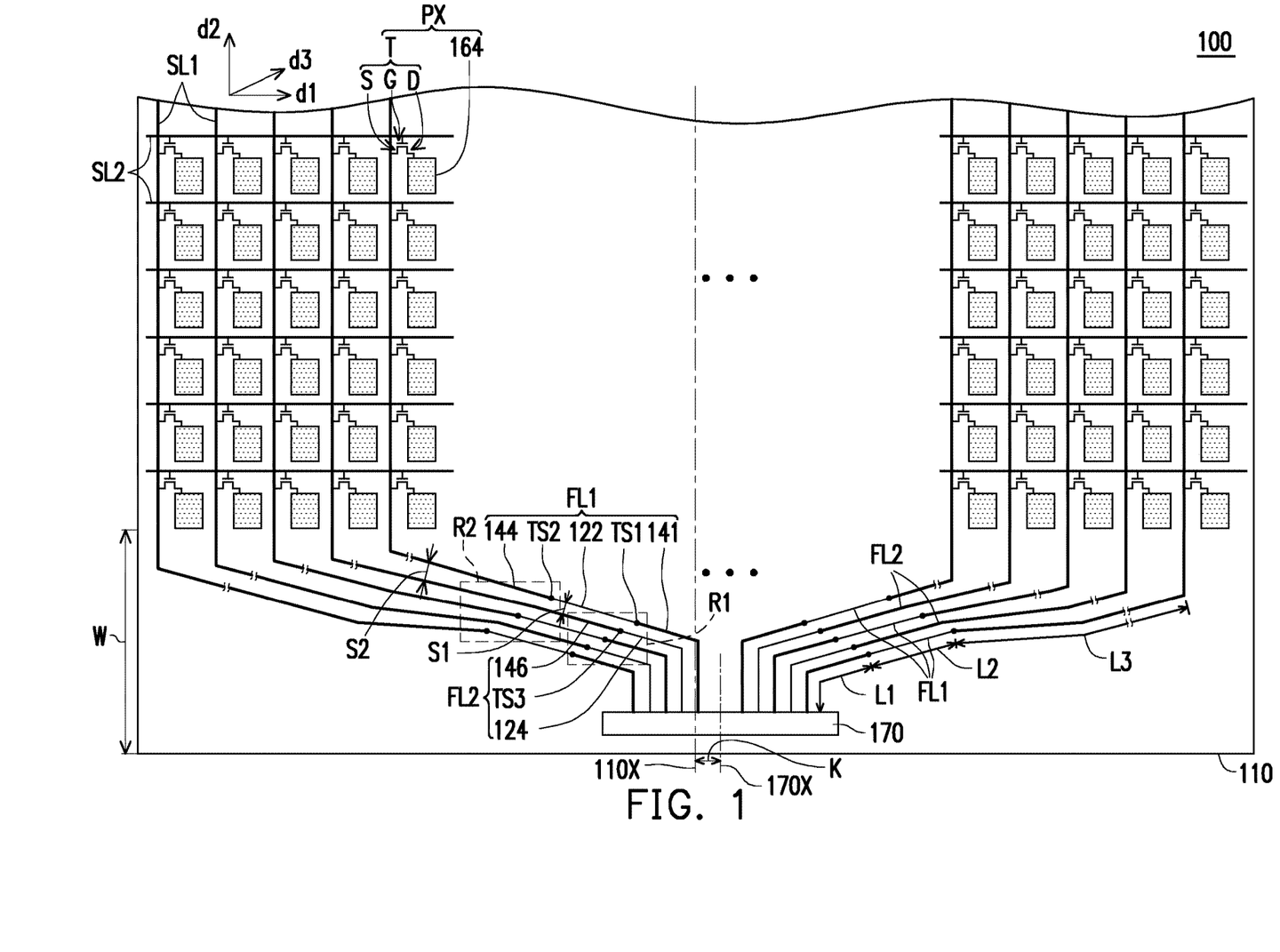
FIG. 1 is a schematic top view of a pixel array substrate in one embodiment of the disclosure.
Figure 2:
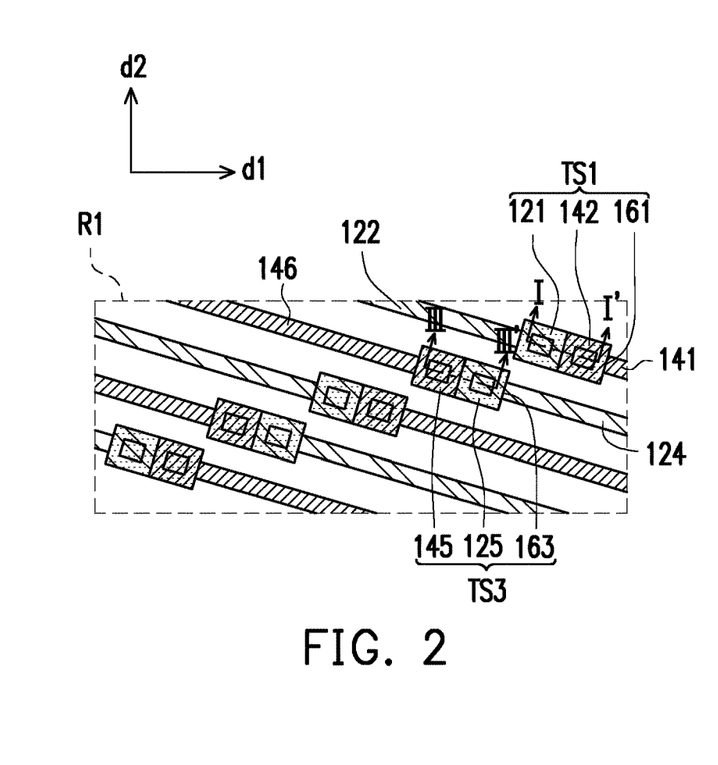
FIG. 2 is an enlarged schematic view of a region R1 of the pixel array substrate in one embodiment of the disclosure.
Figure 3:
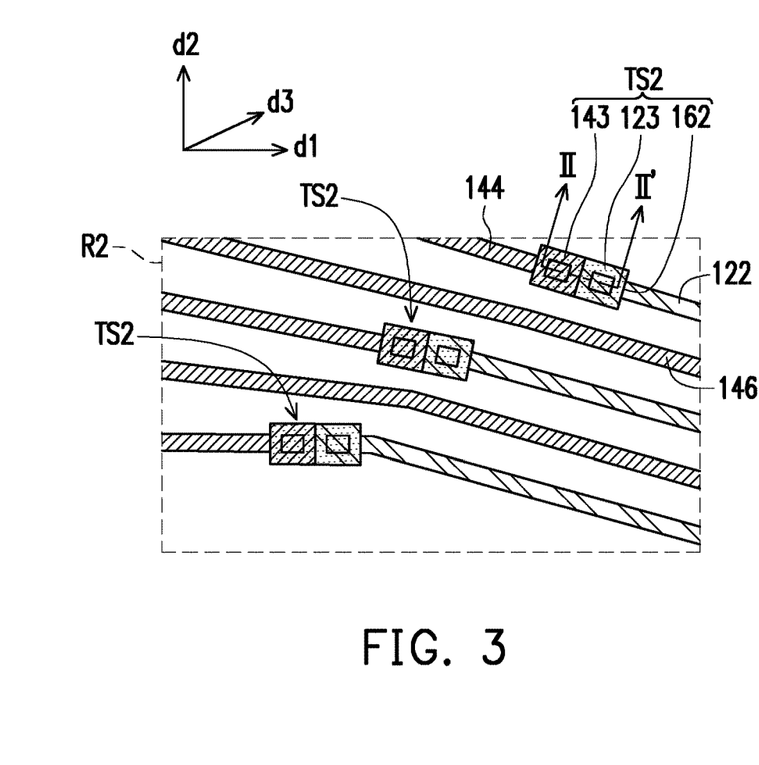
FIG. 3 is an enlarged schematic view of a region R2 of the pixel array substrate in one embodiment of the disclosure.
Figure 4:
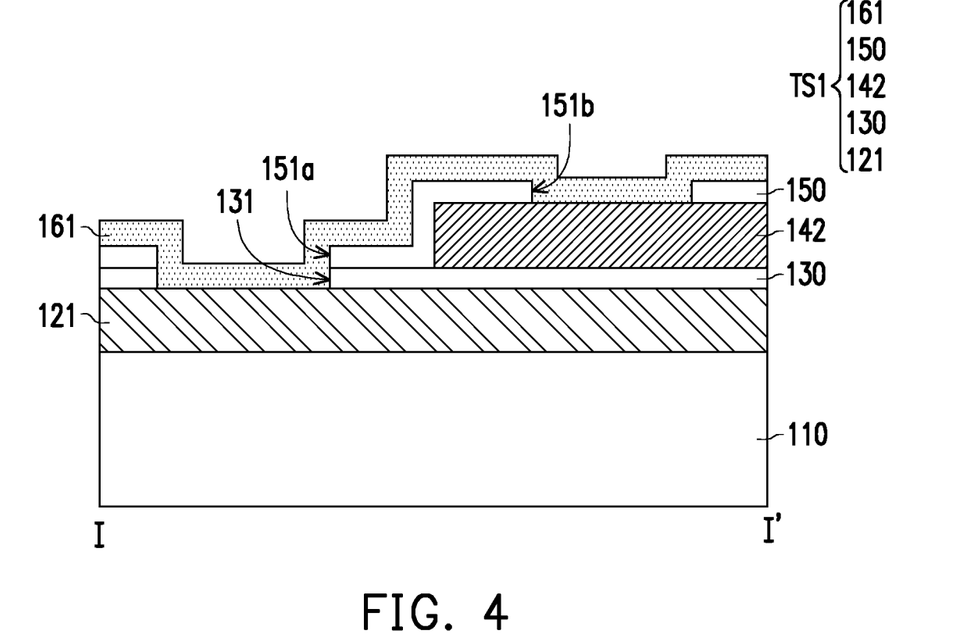
FIG. 4 is a cross-sectional schematic view of the pixel array substrate in one embodiment of the disclosure.
Figure 5:
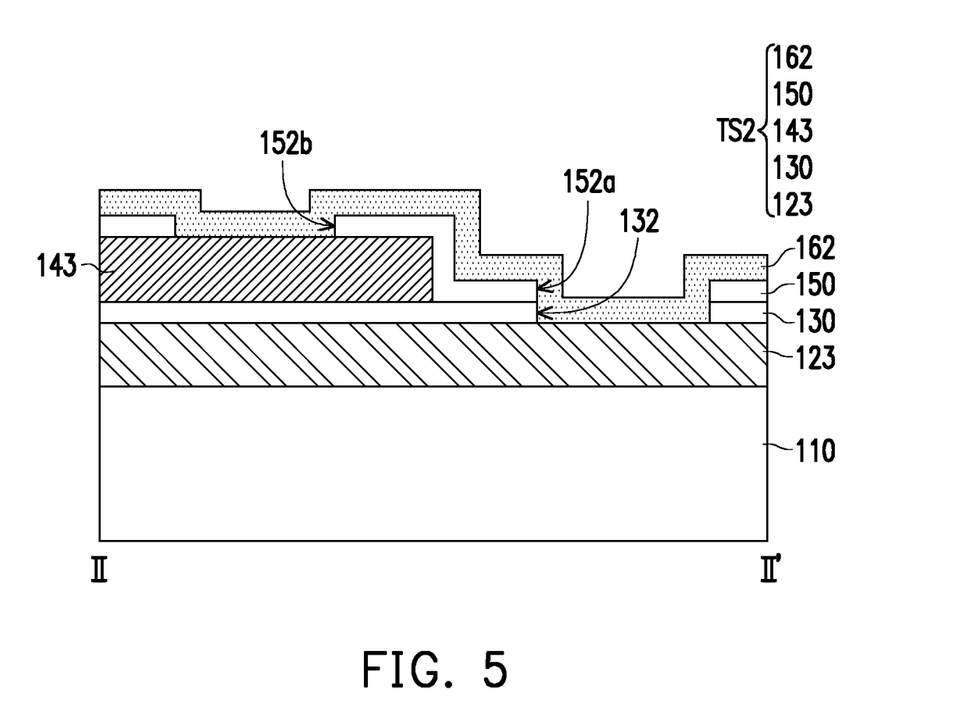
FIG. 5 is a cross-sectional schematic view of the pixel array substrate in one embodiment of the disclosure.
Figure 6:
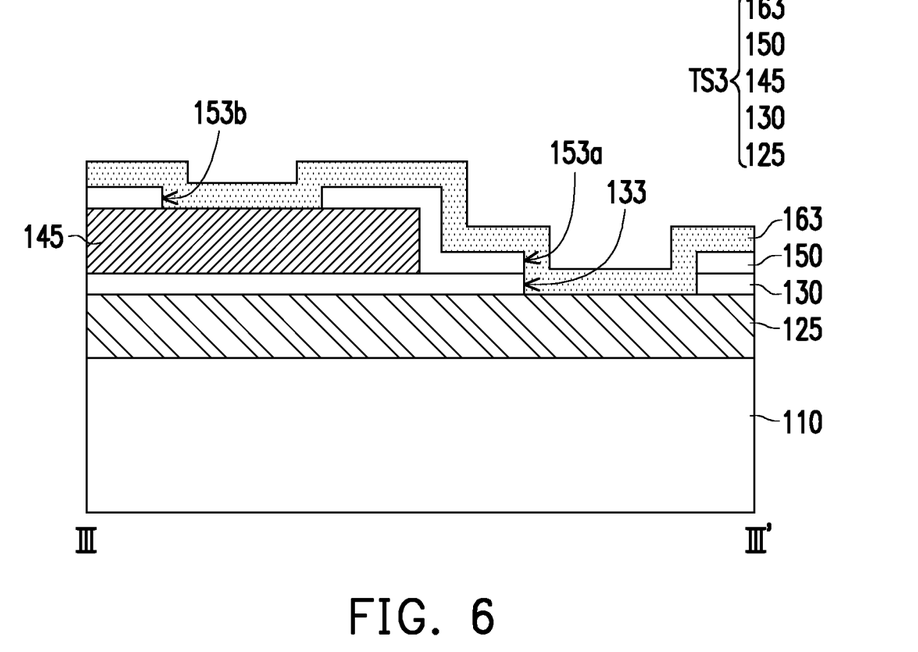
FIG. 6 is a cross-sectional schematic view of the pixel array substrate in one embodiment of the disclosure.

FIG. 1 is a schematic top view of a pixel array substrate in one embodiment of the disclosure. FIG. 2 is an enlarged schematic view of a region R1 of the pixel array substrate in one embodiment of the disclosure. FIG. 3 is an enlarged schematic view of a region R2 of the pixel array substrate in one embodiment of the disclosure. FIG. 4 is a cross-sectional schematic view of the pixel array substrate in one embodiment of the disclosure. FIG. 4 is a cross-sectional view along a section line I-I' in FIG. 2. FIG. 5 is a cross-sectional schematic view of the pixel array substrate in one embodiment of the disclosure. FIG. 5 is a cross-sectional view along a section line II-II' in FIG. 3. FIG. 6 is a cross-sectional schematic view of the pixel array substrate in one embodiment of the disclosure. FIG. 6 is a cross-sectional view along a section line III-III' in FIG. 2.

Referring to FIG. 1, a pixel array substrate 100 includes a substrate 110. The substrate 110 is mainly used to carry components of the pixel array substrate 100. For example, in the present embodiment, the substrate 110 may be made of glass, quartz, organic polymers, or opaque/reflective materials (such as conductive materials, wafers, ceramics, or other suitable materials), or other appropriate materials.

The pixel array substrate 100 further includes a plurality of signal line SL1 disposed on the substrate 110, a plurality of signal lines SL2 disposed on the substrate 110, and a plurality of pixel structures PX disposed on the substrate 110. The pixel structure PX may include an active element T and a pixel electrode 164 electrically connected to the active element T. For example, in the present embodiment, the active element T includes a thin film transistor that has a source S, a gate G and a drain D, and the pixel electrode 164 is electrically connected to the drain D of the thin film transistor. The signal lines SL1 are arranged in the direction d1, and the signal lines SL2 are arranged in the direction d2, wherein the direction d1 and the direction d2 intersect. For example, as an option in the present embodiment, the direction d1 and the direction d2 may be perpendicular to each other, but the disclosure is not limited thereto. The pixel structures PX are electrically connected to the signal lines SL1 and the signal lines SL2. For example, in the present embodiment, the source S of the active element T of the pixel structure PX is electrically connected to the signal line SL1, and the gate G of the active element T of the pixel structure PX is electrically connected to the signal line SL2. In other words, in the present embodiment, the signal line SL1 may be a data line, and the signal line SL2 may be a scan line, but the disclosure is not limited thereto.

The pixel array substrate 100 further includes a driving element 170 disposed on the substrate 110. For example, in the present embodiment, the driving element 170 may include an integrated circuit (IC), but the disclosure is not limited thereto. In the present embodiment, the driving element 170 has a central axis 170X, and the substrate 110 has a central axis 110X. The extending direction of the central axis 170X (such as the direction d2) and the extending direction of the central axis 110X (such as the direction d2) and the arranging direction d1 of the signal lines SL1 intersect, but the disclosure is not limited thereto. It is noteworthy that, in the present embodiment, in the direction d1, the central axis 170X of the driving element 170 has a distance K from the central axis 110X of the substrate 110. In other words, in the present embodiment, the central axis 170X of the driving element 170 is offset from the central axis 110X of the substrate 110, but the disclosure is not limited thereto.

The pixel array substrate 100 further includes a plurality of fan-out traces FL1 and FL2 disposed on the substrate 110. To be more specific, in the present embodiment, a plurality of orthogonal projections of the fan-out traces FL1 and FL2 on the substrate 110 may be located between a plurality of orthogonal projections of the pixel structures PX on the substrate 110 and an orthogonal projection of the driving element 170 on the substrate 110. Each of the fan-out traces FL1 and FL2 is electrically connected to one of the signal lines SL1 and SL2 and the driving element 170. In the embodiment shown in FIG. 1, each of the fan-out traces FL1 and FL2 is electrically connected to a corresponding one of the signal lines SL1 as an example. However, the disclosure is not limited thereto. In another embodiment, the fan-out traces FL1 and FL2 may also be electrically connect to the signal lines SL1 and the signal lines SL2. In yet another embodiment, each of the fan-out traces FL1 and FL2 may also be electrically connected to a corresponding one of the signal lines SL2.

Referring to FIG. 1, FIG. 2, and FIG. 3, the fan-out traces FL1 and FL2 of the pixel array substrate 100 include the first fan-out traces FL1. In the present embodiment, each of the first fan-out traces FL1 includes the first segment 141, a transfer structure TS1, the second segment 122, a transfer structure TS2, and the third segment 144 sequentially arranged from the driving element 170 to the corresponding one of the signal lines SL1. The driving element 170 is connected to the first segment 141. The first segment 141 is connected to the transfer structure TS1. The transfer structure TS1 is connected to the second segment 122. The second segment 122 is connected to the transfer structure TS2. The transfer structure TS2 is connected to the third segment 144. The third segment 144 is connected to the corresponding one of the signal lines SL1.

In the present embodiment, a sheet resistance of the first segment 141 of the first fan-out trace FL1 may be substantially equal to a sheet resistance of the third segment 144 of the first fan-out trace FL1. In the present embodiment, the first segment 141 of the first fan-out trace FL1 and the third segment 144 of the first fan-out trace FL1 may be optionally formed by the same conductive layer, such as the second metal layer, but the disclosure is not limited thereto. For example, in the present embodiment, the material of the first segment 141 of the first fan-out trace FL1 and the material of the third segment 144 of the first fan-out trace FL1 may be molybdenum (Mo), and the sheet resistance of molybdenum is about 0.47Ω/□. However, the disclosure is not limited thereto. The first segment 141 of the first fan-out trace FL1 and the third segment 144 of the first fan-out trace FL1 may also adopt other appropriate conductive materials.

In the present embodiment, the sheet resistance of the first segment 141 of the first fan-out trace FL1 and the sheet resistance of the third segment 144 of the first fan-out trace FL1 are smaller than the sheet resistance of the second segment 122 of the first fan-out trace FL1. For example, in the present embodiment, the material of the second segment 122 of the first fan-out trace FL1 may be a stacked structure of titanium/aluminum/titanium (Ti/Al/Ti), the sheet resistance of the Ti/Al/Ti stacked structure is about 0.1Ω/□. However, the disclosure is not limited thereto. The second segment 122 of the first fan-out trace FL1 may also adopt other appropriate conductive materials. Additionally, in the present embodiment, the second segment 122 of the first fan-out trace FL1 is formed by the first metal layer as an example. In other words, the first insulating layer 130 is disposed between the second segment 122 of the first fan-out trace FL1 and the first segment 141 of the first fan-out trace FL1 (as shown in FIG. 4), the first insulating layer 130 is disposed between the second segment 122 of the first fan-out trace FL1 and the third segment 144 of the first fan-out trace FL1 (as shown in FIG. 5), but the disclosure is not limited thereto.

Referring to FIG. 1, in the present embodiment, the first segment 141 of the first fan-out trace FL1 has a length L1, the second segment 122 of the first fan-out trace FL1 has a length L2, the third segment 144 of the first fan-out trace FL1 has a length L3, and (L1+L2)/(L1+L2+L3)≤50%. For example, the length L1 of the first segment 141 of the first fan-out trace FL1 may be substantially equal to the length L2 of the second segment 122 of the first fan-out trace FL1, and the length L3 of the third segment 144 of the first fan-out trace FL1 is much greater than the length L1 of the first segment 141 of the first fan-out trace FL1 and the length L2 of the second segment 122 of the first fan-out trace FL1.

Referring to FIG. 1, FIG. 2, and FIG. 4, in the present embodiment, the transfer structure TS1 of the first fan-out trace FL1 includes a conductive pattern 121, the first insulating layer 130, a conductive pattern 142, the second insulating layer 150, and a bridge pattern 161. The conductive pattern 142 is directly connected to the first segment 141 of the first fan-out trace FL1. The conductive pattern 142 of the transfer structure TS1 and the first segment 141 of the first fan-out trace FL1 may be formed by the same film. The conductive pattern 121 is directly connected to the second segment 122 of the first fan-out trace FL1. The conductive pattern 121 of the transfer structure TS1 and the second segment 122 of the first fan-out trace FL1 may be formed by the same film. The first insulating layer 130 is disposed between the conductive pattern 121 and the conductive pattern 142. The second insulating layer 150 is disposed on the conductive pattern 142 and has at least one contact window 151a and 151b.

For example, in the present embodiment, as an option, the second insulating layer 150 may have the contact windows 151a and 151b separate from each other and respectively located on the conductive patterns 121 and 142. The bridge pattern 161 is located on the second insulating layer 150 and is electrically connected to the conductive pattern 121 and the conductive pattern 142 through the at least one contact window 151a and 151b of the second insulating layer 150. In the present embodiment, the bridge pattern 161 is electrically connected to the conductive pattern 121 through the contact window 151a of the second insulating layer 150 and the contact window 131 of the first insulating layer 130. The contact window 151a of the second insulating layer 150 and the contact window 131 of the first insulating layer 130 are substantially aligned with each other, but the disclosure is not limited thereto. On the other hand, the bridge pattern 161 is electrically connected to the conductive pattern 142 through the contact window 151b of the second insulating layer 150. In the present embodiment, as an option, the bridge pattern 161 and the pixel electrode 164 may be formed by the same film, but the disclosure is not limited thereto.

Referring to FIG. 1, FIG. 3, and FIG. 5, in the present embodiment, the transfer structure TS2 of the first fan-out trace FL1 includes a conductive pattern 123, the first insulating layer 130, a conductive pattern 143, the second insulating layer 150, and a bridge pattern 162. The conductive pattern 123 is directly connected to the second segment 122 of the first fan-out trace FL1. The conductive pattern 123 of the transfer structure TS2 and the second segment 122 of the first fan-out trace FL1 may be formed by the same film. The conductive pattern 143 is directly connected to the third segment 144 of the first fan-out trace FL1. The conductive pattern 143 of the transfer structure TS2 and the third segment 144 of the first fan-out trace FL1 may be formed by the same film. The first insulating layer 130 is disposed between the conductive pattern 123 and the conductive pattern 143. The second insulating layer 150 is disposed on the conductive pattern 143 and has at least one contact window 152a and 152b.

For example, in the present embodiment, as an option, the second insulating layer 150 may have the contact windows 152a and 152b separate from each other and respectively located on the conductive patterns 123 and 143. The bridge pattern 162 is located on the second insulating layer 150 and is electrically connected to the conductive pattern 123 and the conductive pattern 143 through the at least one contact window 152a and 152b of the second insulating layer 150. In the present embodiment, the bridge pattern 162 is electrically connected to the conductive pattern 123 through the contact window 152a of the second insulating layer 150 and the contact window 132 of the first insulating layer 130. The contact window 152a of the second insulating layer 150 and the contact window 132 of the first insulating layer 130 are substantially aligned with each other, but the disclosure is not limited thereto. On the other hand, the bridge pattern 162 is electrically connected to the conductive pattern 143 through the contact window 152b of the second insulating layer 150. In the present embodiment, as an option, the bridge pattern 162 and the pixel electrode 164 may be formed by the same film, but the disclosure is not limited thereto.

Referring to FIG. 1, FIG. 2, and FIG. 6, the fan-out traces FL1 and FL2 of the pixel array substrate 100 include the second fan-out traces FL2. In the present embodiment, each of the second fan-out traces FL2 includes the first segment 124, a transfer structure TS3, and the second segment 146 sequentially arranged from the driving element 170 to the corresponding one of the signal lines SL1. The driving element 170 is connected to the first segment 124. The first segment 124 is connected to the transfer structure TS3. The transfer structure TS3 is connected to the second segment 146. The second segment 146 is connected to the corresponding and different one of the signal lines SL1. The sheet resistance of the second segment 146 of the second fan-out trace FL2 is less than the sheet resistance of the first segment 124 of the second fan-out trace FL2.

Referring to FIG. 1, the first segment 124 of the second fan-out trace FL2 is disposed correspondingly to the first segment 141 of the first fan-out trace FL1. The second segment 146 of the second fan-out trace FL2 is disposed correspondingly to the second segment 122 and the third segment 144 of the first fan-out trace FL1. For example, in the present embodiment, the first segment 124 of the second fan-out trace FL2 and the first segment 141 of the first fan-out trace FL1 may be respectively formed by two different films (such as the first metal layer and the second metal layer), and the second segment 146 of the second fan-out trace FL2 and the second segment 122 of the first fan-out trace FL1 may be respectively formed by two different films (such as the second metal layer and the first metal layer), but the disclosure is not limited thereto. Accordingly, disposed corresponding to each other, a part (such as: the first segment 141/the second segment 122) of the first fan-out trace FL1 and a part (such as the first segment 124/the second segment 146) of the second fan-out trace FL2 that are disposed corresponding to each other may be densely arranged near the driving element 170, so as to reduce the width W of the border of the pixel array substrate 100. Furthermore, in the present embodiment, the longer part (such as the third segment 144) of the first fan-out trace FL1 and the longer part (such as the second segment 146) of the second fan-out trace FL2 have lower sheet resistance, so as to prevent the impedance of the first and second fan-out traces FL1 and FL2 from greatly increasing and causing insufficient charging of the pixel structure PX.

Otherwise, the present embodiment, the first space S1 between the first fan-out trace FL1 and the second fan-out trace FL2 close to the driving element 170 may be smaller than the second space S2 between the first fan-out trace FL1 and the second fan-out trace FL2 far from the driving element 170. For example, the first space S1 indicates a space between an orthogonal projection of the second segment 122 of the first fan-out trace FL1 on the substrate 110 and an orthogonal projection of the second segment 146 of the second fan-out trace FL2 on the substrate 110, and the second space S2 indicates a space between an orthogonal projection of the third segment 144 of the first fan-out trace FL1 on the substrate 110 and an orthogonal projection of the second segment 146 of the second fan-out trace FL2 on the substrate 110.

Referring to FIG. 1, FIG. 2, and FIG. 6, in the present embodiment, the transfer structure TS3 of the second fan-out trace FL2 includes a conductive pattern 125, the first insulating layer 130, a conductive pattern 145, the second insulating layer 150, and a bridge pattern 163. The conductive pattern 125 is directly connected to the first segment 124 of the second fan-out trace FL2. The conductive pattern 125 of the transfer structure TS3 and the first segment 124 of the second fan-out trace FL2 may be formed by the same film. The conductive pattern 145 is directly connected to the second segment 146 of the second fan-out trace FL2. The conductive pattern 145 of the transfer structure TS3 and the second segment 146 of the second fan-out trace FL2 may be formed by the same film. The first insulating layer 130 is disposed between the conductive pattern 125 and the conductive pattern 145. The second insulating layer 150 is disposed on the conductive pattern 145 and has at least one contact window 153a and 153b.

For example, in the present embodiment, as an option, the second insulating layer 150 may have the contact windows 153a and 153b separate from each other and respectively located on the conductive patterns 125 and 145. The bridge pattern 163 is located on the second insulating layer 150 and is electrically connected to the conductive pattern 125 and the conductive pattern 145 through the at least one contact window 153a and 153b of the second insulating layer 150. In the present embodiment, the bridge pattern 163 is electrically connected to the conductive pattern 125 through the contact window 153a of the second insulating layer 150 and the contact window 133 of the first insulating layer 130. The contact window 153a of the second insulating layer 150 and the contact window 133 of the first insulating layer 130 are substantially aligned with each other, but the disclosure is not limited thereto. On the other hand, the bridge pattern 163 is electrically connected to the conductive pattern 145 through the contact window 153b of the second insulating layer 150. In the present embodiment, as an option, the bridge pattern 163 and the pixel electrode 164 may be formed by the same film, but the disclosure is not limited thereto.

Referring to FIG. 1 and FIG. 3, in the present embodiment, the signal lines SL1 are arranged in the direction d1, the transfer structures TS2 of the first fan-out traces FL1 are arranged in the third direction d3, and the direction d1 and the direction d3 intersect but are not perpendicular to each other. In other words, in the present embodiment, the arrangement of the transfer structures TS2 may be a ladder-shaped arrangement. However, the disclosure is not limited thereto. In other embodiments, the arrangement of the transfer structures TS2 may be other appropriate methods, the description accompanying the drawings of other embodiments are mentioned hereinafter.

Figure 7:
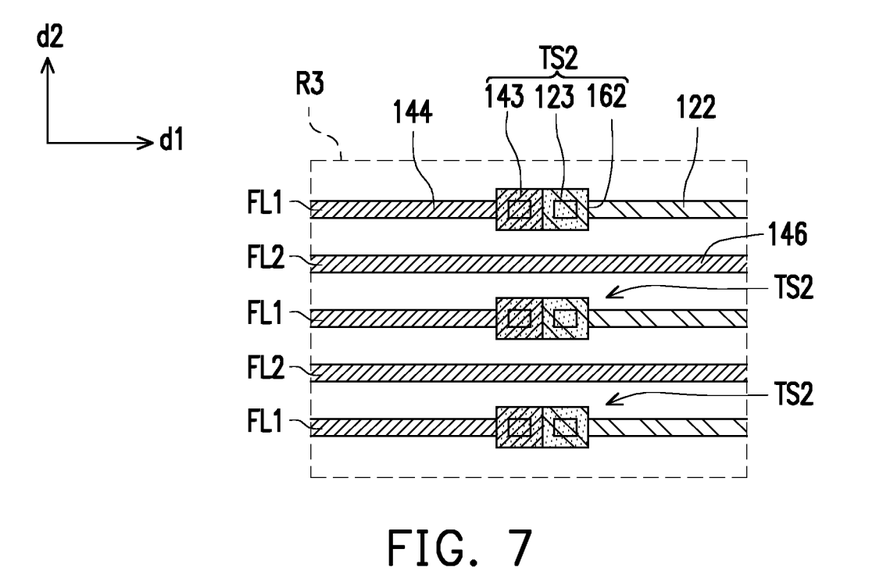
FIG. 7 is an enlarged schematic view of a region R3 of a pixel array substrate in another embodiment of the disclosure.

FIG. 7 is an enlarged schematic view of a region R3 of a pixel array substrate in another embodiment of the disclosure. In the embodiment of FIG. 7, as an option, the transfer structures TS2 of the first fan-out traces FL1 may be arranged in the second direction d2, and the second direction d2 may be perpendicular to the first direction d1. In other words, in the present embodiment, the arrangement of the transfer structures TS2 may be a vertical arrangement.

Figure 8:
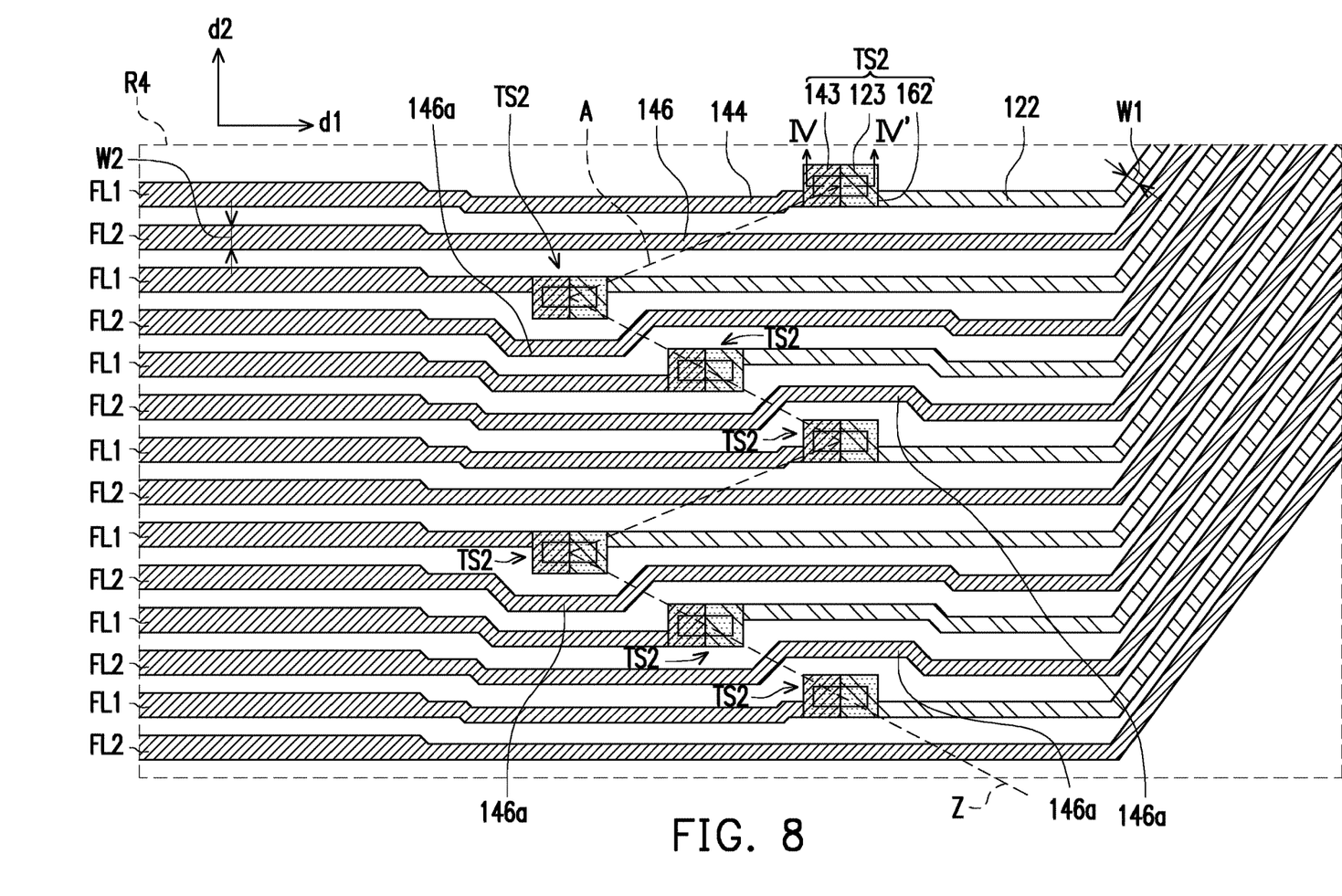
FIG. 8 is an enlarged schematic view of a region R4 of a pixel array substrate in yet another embodiment of the disclosure.

FIG. 8 is an enlarged schematic view of a region R4 of a pixel array substrate in yet another embodiment of the disclosure. In the embodiment of FIG. 8, the first fan-out traces FL1 includes a plurality of transfer structures TS2, respectively. A plurality of virtual straight lines A pass through the transfer structures TS2, each of the virtual straight lines A passes through two adjacent transfer structures TS2, and the virtual straight lines A may be connected to form a virtual zigzag line Z. In other words, in the present embodiment, the arrangement of the transfer structures TS2 may be a zigzag arrangement.

Additionally, in the embodiment of FIG. 8, the second segments 146 of the second fan-out traces FL2 have a plurality of bent portions 146a, respectively. The bent portions 146a are disposed correspondingly to the transfer structures TS2 of the first fan-out traces FL1, respectively. Thereby, the first fan-out traces FL1 and the second fan-out traces FL2 are more densely arranged, so as to reduce the width (not shown) of the border of the pixel array substrate.

Figure 9:
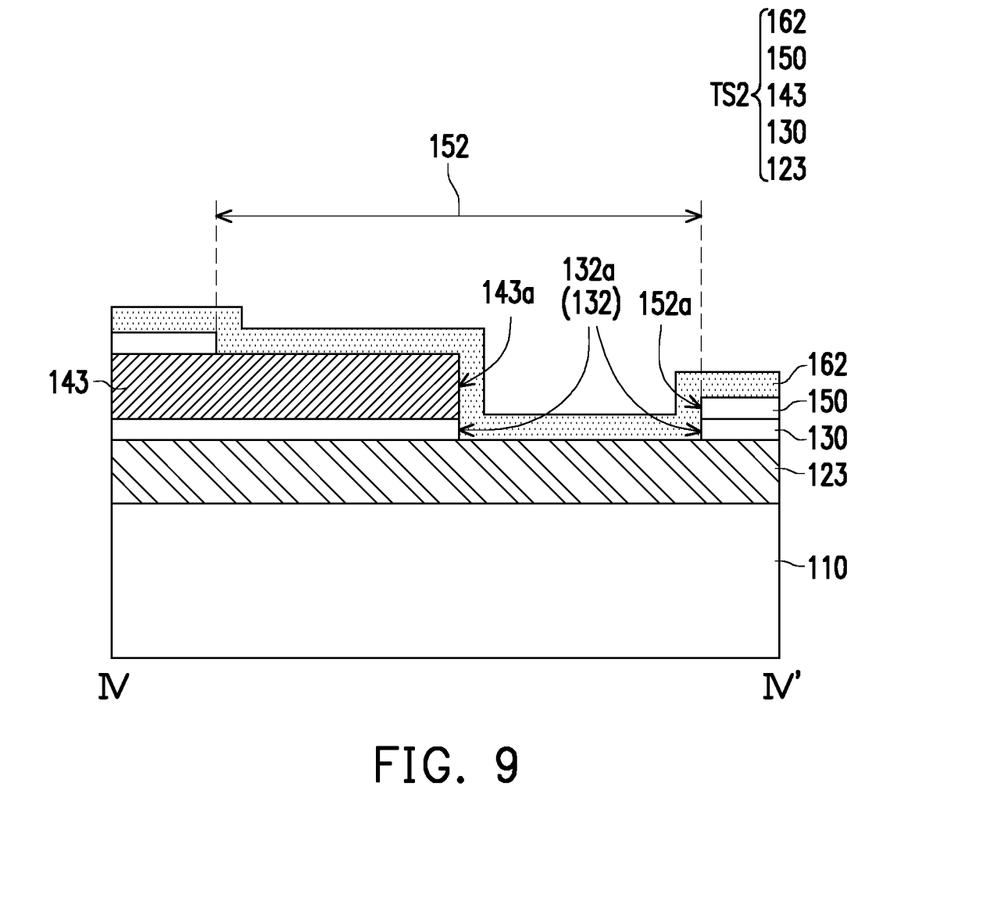
FIG. 9 is a cross-sectional schematic view of the pixel array substrate in yet another embodiment of the disclosure.

FIG. 9 is a cross-sectional schematic view of the pixel array substrate in yet another embodiment of the disclosure. FIG. 9 is a cross-sectional view along a section line IV-IV' in FIG. 8. The transfer structure TS2 in FIG. 9 is slightly different from the transfer structure TS2 of FIG. 5. To be more specific, in the embodiment of FIG. 9, the edge 132a of the contact window 132 of the first insulating layer 130 and a part 143a of the edge of the conductive pattern 143, and a part 152a of the edge of the contact window 152 of the second insulating layer 150 are substantially aligned. In other words, in the embodiment of FIG. 9, the bridge pattern 162 is electrically connected to the conductive pattern 123 and the conductive pattern 143 through the single contact window 152. Accordingly, the area occupied by the transfer structure TS2 can be reduced, which helps to reduce the width (not shown) of the border of the pixel array substrate.

The transfer structure TS2 having one contact window 152 of FIG. 9 may be applied to any of the transfer structures TS1, TS2 and/or TS3 of the aforementioned embodiments. The ordinary skill in the art should be able to implement according to the foregoing description, and the description and illustrations are not repeated.

In addition, in the present embodiment, a part of the second segment 122, which is close to the driving component 170 (shown in FIG. 1), of the first fan-out trace FL1 has a line width W1, and a part of the second segment 146, which is far from the driving component 170, of the second fan-out trace FL2 has a line width W2, and W2>W1. The part, which has the line width W1, of the second segment 122 of the first fan-out trace FL1 and the part, which has the line width W2, of the second segment 146 of the second fan-out trace FL2 are respectively located on two sides of the transfer structure TS2 of the first fan-out trace FL1.

The line width W1 of the part of the second segment 122, which is close to the driving component 170 (shown in FIG. 1), of the first fan-out trace FL1 is small, so as to able to dispose a greater number of fan-out traces FL1 and FL2 near the driving element 170. The line width W2 of the second segment 146, which is far from the driving component 170, of the second fan-out trace FL2 is large, so as to reduce impedance and improve the electrical properties of the pixel array substrate.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A pixel array substrate, comprising:
   a substrate;
   a plurality of signal lines, disposed on the substrate;
   a plurality of pixel structures, electrically connected to the signal lines;
   a driving element, disposed on the substrate; and
   a plurality of fan-out traces, wherein each of the fan-out traces is electrically connected to one of the signal lines and the driving element;
   wherein the fan-out traces comprise at least one first fan-out trace and at least one second fan-out trace,
   each of the at least one first fan-out trace comprises:
      a first segment, connected to the driving element;
      a second segment, connected to the first segment; and
      a third segment, connected to the second segment, wherein a sheet resistance of the first segment of each of the at least one first fan-out trace and a sheet resistance of the third segment of the at least one first fan-out trace are smaller than a sheet resistance of the second segment of the at least one first fan-out trace;
   each of the at least one second fan-out trace comprises:
      a first segment, connected to the driving element and disposed correspondingly to the first segment of each of the at least one first fan-out trace; and
      a second segment, connected to the first segment of each of the at least one second fan-out trace and disposed correspondingly to the second segment and the third segment of each of the at least one first fan-out trace, wherein a sheet resistance of the second segment of each of the at least one second fan-out trace is less than a sheet resistance of the first segment of each of the at least one second fan-out trace.

2. The pixel array substrate as recited in claim 1, wherein each of the at least one first fan-out trace comprises a transfer structure, and the transfer structure comprises:
   a first conductive pattern, directly connected to the second segment of each of the at least one first fan-out trace;
   a second conductive pattern, directly connected to the third segment of each of the at least one first fan-out trace;
   a first insulating layer, disposed between the first conductive pattern and the second conductive pattern;
   a second insulating layer, disposed on the second conductive pattern and having at least one contact window; and
   a bridge pattern, disposed on the second insulating layer and electrically connecting the first conductive pattern with the second conductive pattern through the at least one contact window of the second insulating layer.

3. The pixel array substrate as recited in claim 2, wherein the first insulating layer has a contact window, an edge of the contact window of the first insulating layer, a part of an edge of the second conductive pattern, and a part of an edge of the at least one contact window of the second insulating layer are substantially aligned.

4. The pixel array substrate as recited in claim 2, wherein the signal lines are arranged in a first direction, the at least one first fan-out trace comprises a plurality of first fan-out traces, transfer structures of the first fan-out traces are arranged in a second direction, and the first direction is perpendicular to the second direction.

5. The pixel array substrate as recited in claim 2, wherein the signal lines are arranged in a first direction, the at least one first fan-out trace comprises a plurality of first fan-out traces, transfer structures of the first fan-out traces are arranged in a third direction, the first direction and the third direction are intersected, and the first direction is not perpendicular to the third direction.

6. The pixel array substrate as recited in claim 2, wherein the at least one first fan-out trace comprises a plurality of first fan-out traces, the first fan-out traces comprises a plurality of transfer structures, respectively, a plurality of virtual straight lines pass through the transfer structures, each of the virtual straight lines passes through two adjacent transfer structures in the transfer structures, and the virtual straight lines are connected to form a virtual zigzag line.

7. The pixel array substrate as recited in claim 2, wherein the at least one first fan-out trace comprises a plurality of first fan-out traces, the first fan-out traces comprises a plurality of transfer structures, respectively, the at least one second fan-out trace comprises a plurality of second fan-out traces, second segments of the second fan-out traces have a plurality of bent portions, respectively, and the bent portions of the second fan-out traces are disposed correspondingly to the transfer structures of the first fan-out traces, respectively.

8. The pixel array substrate as recited in claim 1, wherein an orthogonal projection of the second segment of each of the at least one first fan-out trace on the substrate and an orthogonal projection of the second segment of each of the at least one second fan-out trace on the substrate have a first space S1 therebetween, an orthogonal projection of the third segment of each of the at least one first fan-out trace on the substrate and an orthogonal projection of the second segment of each of the at least one second fan-out trace on the substrate have a second space S2 therebetween, and S1<S2.

9. The pixel array substrate as recited in claim 1, wherein a part of the second segment of each of the at least one first fan-out trace has a line width W1, a part of the second segment of each of the at least one second fan-out trace has a line width W2, and W2>W1.

10. The pixel array substrate as recited in claim 1, wherein the first segment of each of the at least one first fan-out trace has a length L1, the second segment of each of the at least one first fan-out trace has a length L2, and the third segment of each of the at least one first fan-out trace has a length L3, and (L1+L2)/(L1+L2+L3)≤50%.

* * * * *